US006388230B1

United States Patent
Nacker et al.

(10) Patent No.: US 6,388,230 B1
(45) Date of Patent: May 14, 2002

(54) LASER IMAGING OF THIN LAYER ELECTRONIC CIRCUITRY MATERIAL

(75) Inventors: Wayne E. Nacker, La Grange, IL (US); Richard W. Carpenter, Johnson City, NY (US)

(73) Assignee: Morton International, Inc., Chicago, IL (US)

( * ) Notice: Subject to any disclaimer, the term of this patent is extended or adjusted under 35 U.S.C. 154(b) by 0 days.

(21) Appl. No.: 09/418,207

(22) Filed: Oct. 13, 1999

(51) Int. Cl.[7] .......................... B23K 26/00; B23K 26/14
(52) U.S. Cl. .............................. 219/121.69; 219/121.68
(58) Field of Search ................... 219/121.68, 121.69, 219/121.71; 216/13; 29/830

(56) References Cited

U.S. PATENT DOCUMENTS

| | | | |
|---|---|---|---|
| 3,364,087 A | 1/1968 | Solomon et al. ............... 156/4 |
| 3,622,742 A | 11/1971 | Cohen ..................... 219/121 L |
| 3,867,217 A | 2/1975 | Maggs et al. ................... 156/3 |
| 4,072,768 A | 2/1978 | Fraser et al. ................... 427/34 |
| 4,081,653 A | * 3/1978 | Koo et al. ............ 219/121 LM |
| 4,388,517 A | 6/1983 | Schulte et al. ......... 219/121 LJ |
| 4,490,210 A | 12/1984 | Chen et al. ................. 156/643 |
| 4,622,095 A | 11/1986 | Grobman et al. ........... 156/635 |
| 4,643,799 A | 2/1987 | Tsujii et al. ................. 156/635 |
| 4,680,855 A | 7/1987 | Yamazaki et al. ............ 29/583 |
| 4,681,656 A | 7/1987 | Byrum et al. ............... 156/645 |
| 4,730,095 A | 3/1988 | Richter-Jorgesen ......... 219/121 |
| 4,743,463 A | 5/1988 | Ronn et al. ................. 427/53.1 |
| 4,764,485 A | 8/1988 | Loughran et al. ........... 437/225 |
| 4,780,177 A | 10/1988 | Wojnarowski et al. ...... 156/643 |
| 4,898,648 A | 2/1990 | Cusano et al. ................ 204/15 |
| 4,909,895 A | * 3/1990 | Cusano ........................ 156/643 |
| 5,032,233 A | * 7/1991 | Yu et al. ................. 204/192.28 |
| 5,066,357 A | 11/1991 | Smyth, Jr. et al. ........... 156/643 |
| 5,088,008 A | 2/1992 | Takeyama et al. .......... 361/403 |
| 5,091,286 A | 2/1992 | Person ........................ 430/297 |
| 5,093,279 A | 3/1992 | Andreshak et al. .......... 437/173 |
| 5,095,627 A | * 3/1992 | Bujagec et al. ................ 29/832 |
| 5,104,480 A | * 4/1992 | Wojnarowski et al. ...... 156/643 |
| 5,130,192 A | * 7/1992 | Takabayashi et al. ....... 428/332 |
| 5,221,426 A | * 6/1993 | Tessier et al. ............... 156/643 |
| 5,274,912 A | 1/1994 | Olenick et al. ................ 29/830 |
| 5,472,828 A | 12/1995 | Akins et al. ................. 430/318 |
| 5,505,320 A | 4/1996 | Burns et al. ................... 216/13 |
| 5,509,553 A | 4/1996 | Hunter, Jr. et al. ............ 216/13 |

(List continued on next page.)

FOREIGN PATENT DOCUMENTS

EP          0 062 300 A2     10/1982

Primary Examiner—Tom Dunn
Assistant Examiner—L. Edmondson
(74) Attorney, Agent, or Firm—S. Matthew Cairns

(57) ABSTRACT

To form thin film electrical components, a thin film having desired electrical properties is deposited on a substrate of dissimilar material. Thermal energy from a computer guided laser is used to remove selected portions of the thin film. In accordance with one aspect of the invention, the thin film is an electrically conducting material, such as platinum or doped platinum, and the substrate is metal foil, such as copper foil. The thermal energy from the laser ablates away portions of the thin film. In accordance with another aspect of the invention, a layer of zero valence metal is deposited on a dielectric material substrate which has a melting point or decomposition temperature substantially above that of the zero valence metal. The zero valence metal layer is patterned to form electronic circuitry components by computer guided laser which provides sufficient thermal energy to boil away selected portions of the zero valence metal layer. In one preferred embodiment, electronic circuitry is formed from a three-layer composite comprising nickel foil; a dielectric material, such as silica deposited on the foil; and a zinc layer deposited on the dielectric material. The zinc layer, having a boiling point substantially below the melting points of the dielectric material and the nickel foil, is patterned by laser-derived thermal energy.

24 Claims, 2 Drawing Sheets

U.S. PATENT DOCUMENTS

| | | | |
|---|---|---|---|
| 5,576,073 A | 11/1996 | Kickelhain et al. | 427/555 |
| 5,593,606 A | 1/1997 | Owen et al. | 219/121.71 |
| 5,609,746 A | 3/1997 | Farrar et al. | 205/125 |
| 5,626,771 A | 5/1997 | Davis et al. | 216/13 |
| 5,709,957 A * | 1/1998 | Chiang et al. | 428/615 |
| 5,759,416 A | 6/1998 | Bosman et al. | 216/13 |
| 5,766,497 A | 6/1998 | Mitwalsky et al. | 216/56 |
| 5,808,272 A * | 9/1998 | Sun et al. | 219/121.68 |
| 5,820,948 A * | 10/1998 | Itozaki et al. | 427/596 |
| 5,824,374 A | 10/1998 | Bradley, Jr. et al. | 427/555 |
| 5,874,369 A | 2/1999 | Faroog et al. | 438/940 |
| 5,885,436 A * | 3/1999 | Ameen et al. | 205/194 |
| 5,895,581 A * | 4/1999 | Grunwald | 216/13 |
| 6,193,911 B1 * | 2/2001 | Hunt et al. | 252/518.1 |

* cited by examiner

LASER IMAGING OF THIN LAYER ELECTRONIC CIRCUITRY MATERIAL

The present invention is directed to patterning material so as to form electronic circuitry components, particularly from thin film materials, such as those which can be deposited by combustion chemical vapor deposition (CCVD) and controlled atmosphere combustion chemical vapor deposition (CACCVD).

BACKGROUND OF THE INVENTION

Most printed circuitry is produced these days by photoimaging processes. In a typical process, the starting material is a blank comprising a dielectric material, such as a fiberglass/epoxy composite, on which is provided a layer of metal, such as copper. The copper is covered with a photoresist. The photoresist is exposed through artwork to actinic radiation. The unexposed portions of the photoresist are developed away (in a negative acting photoresist). Then, the exposed copper is etched away. Finally, the remaining photoimageable composition is stripped.

While resolution through photoimaging processes is continually improving, there remains a need for enhanced resolution. At the same time, photoimaging techniques have inherent resolution limitations. Resolution is limited by the thickness of the metal layer on the blank because chemical etching proceeds sideways as well as through the copper layer. Resolution is also limited by the thickness of the photoresist layer, which in turn is limited by physical parameters. Thus, it is an object of the present invention to provide a process of patterning printed circuitry components, such as circuitry traces, resistors, and capacitor plates with a resolution finer than that of the inherent limitations of photoimaging processes.

U.S. Pat. No. 5,652,021 and U.S. patent application Ser. No. 08/691,853, filed Aug. 2, 1996, the teachings of each of which are incorporated by reference, describe CCVD processes which are useful for depositing a number of metal and metalloid oxides, such as silica, as well as certain zero valence metals, such as platinum. To deposit more reactive metals in zero valence states, such as zinc, nickel, copper, etc. oxidation of the metal must be prevented. To this end, U.S. Pat. No. 09/067,975, the teachings of which are incorporated herein by reference, describe controlled atmosphere combustion chemical vapor deposition (CACCVD) where the amount of oxygen used in the combustion is sufficiently controlled that a variety of zero valence metals, such as zinc, can be deposited. Both CCVD and CACCVD provide for the depositions of very thin, i.e., as thin as 25 nm, continuous, integral films of a variety of materials. Though the present invention does not require that deposited layers described herein be deposited by CCVD and/or CACCVD, these currently represent the best mode known to the inventor of depositing such thin layers, particularly on a large scale such as would be require for production runs.

U.S. patent application Ser. No. 09/198,954, the teachings of which are incorporated herein by reference, teaches the formation of thin film resistors from thin films deposited by CCVD.

SUMMARY OF THE INVENTION

In accordance with one aspect of the invention, there is provided a dielectric material substrate and a thin layer of conductive material deposited thereon, the conductive material having a boiling temperature and the substrate having a melting point or decomposition temperature above that of the boiling point of the conductive material. The conductive material is patterned with computer guided laser which provides sufficient thermal energy to selected portions of the conductive material layer to boil off those portions of the conductive material layer without decomposing or melting the substrate.

In accordance with one preferred aspect of the invention, a three-layer structure is provided comprising a metal foil layer, a thin dielectric material layer, and a conductive material layer. The conductive material layer has a boiling point which is substantially below the melting point or decomposition temperature of the dielectric material and below the melting point of the foil layer. Again, the conductive material is patterned with computer guided laser which provides thermal energy to selected portions of the conductive material layer to boil off those portions of the conductive material layer without decomposing or melting the substrate. One combination of material for such a substrate comprises a nickel foil layer; a metal or metalloid oxide layer, such as silica; and a zinc conductive layer.

In accordance with another aspect of the invention, it is found that a layer of material between about 0.05 and about 3 microns thick on a dissimilar material substrate may be ablated away in a predetermined pattern by thermal energy provided by a computer guided laser. In particular, a conductive material between about 0.05 and about 3 microns thick can be patterned by computer guided laser.

One application for such an ablative process is a thin platinum layer on a substrate of a dissimilar metal, such as copper foil. As described in above-referenced U.S. patent application Ser. No. 09/198,954, the platinum may be doped with a dielectric material, such as silica, such that patches of the platinum layer may be patterned to provide electrical resistor elements. Portions of the platinum layer, when exposed to thermal energy provided by a computer-guided laser, ablate away from the copper foil substrate.

DETAILED DESCRIPTION OF CERTAIN PREFERRED EMBODIMENTS

Herein, the term "boiling point" shall include "sublimation point". Herein, deposition processes will be discussed in terms of preferred CCVD and CACCVD processes, although it is to be understood that thin layers may be deposited by other means, particularly on a small scale.

An important requirement of the process of one aspect of the invention is that the conductive material boil at a temperature sufficiently below, preferably at least 200 ° C. below, that of the material(s) on which it is deposited. In this regard, zinc, which has a melting point of 419° C. and a boiling point of 907° C. is a preferred conductive material layer. Many metals and metalloid oxides have melting temperatures substantially above 907° C.; for example, silica, a material conveniently used in accordance with the invention, has a melting point of 1600° C. and upward. In a three-layer structure comprising a metal foil layer, a thin dielectric material layer, and a thin conductive zinc layer, nickel is a convenient foil having a melting point of 1455° C. In a nickel, silica, zinc composite, thermal energy to the zinc layer can be controlled such that selective portions of the zinc can be boiled away without disturbing either the silica or nickel layers.

Figure 1:
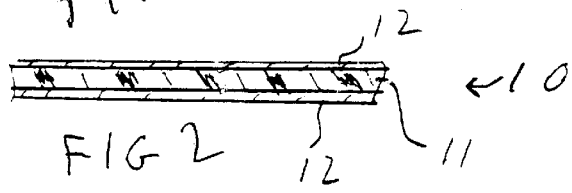
FIG. 1 is a cross-sectional view of a three-layer structure comprising a glass substrate having a zinc layer deposited on either side.

Illustrated in FIG. 1 is a three-layer structure 10 comprising a glass (fused silica) substrate 11 on which has been deposited by CACCVD thin layers 12 of zinc on both sides. The glass 11 is preferably only as thick as is required for structural integrity, i.e., between about 250 and about 4000 microns thick. The zinc layer 12 are preferably each between about 0.05 and about 3 microns thick, i.e., thick enough to carry sufficient electrical charge yet as thin as possible so as to achieve maximum resolution. Because of the relatively low melting point of the zinc compared to the melting point of the glass, thermal energy may be provided to selected portions of the zinc layers 12 to boil away the zinc in those portions without melting the glass substrate 11. Such thermal energy may be provided very precisely and reproducibly by laser which is directed by computer-guided positioners, such as Melles Griot powered positioners that provide nanometer control. Also particularly useful are pulsed laser drilling apparatus positioned by computer, such as sold by Hitachi.

Figure 2:
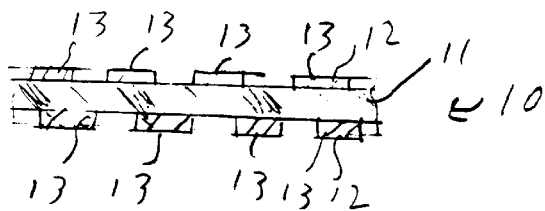
FIG. 2 is the three-layer structure of FIG. 1 which has been patterned in accordance with the invention.

Illustrated in FIG. 2 is the three-layer structure 10 of FIG. 1 in which the zinc layers have been patterned by computer guided laser. The laser removes zinc to leave electrically conductive circuitry traces 13. The circuitry traces 13 on both sides of the glass substrate 11 may be interconnected by via holes in a conventional manner. The circuitry traces may also be embedded in dielectric material (not shown), e.g., epoxy resin known as "pre-preg" such that the circuitry traces become components of multi-layer circuit board. It is to be noted also that patches of zinc on opposite sides of the class define a capacitor electrical pathway. Likewise, as thin zinc is less electrically conductive than copper traces, with which the zinc layers may be interconnected in a multi-layer circuit board, strips of the zinc layer may define resistor electrical pathways.

Figure 3:
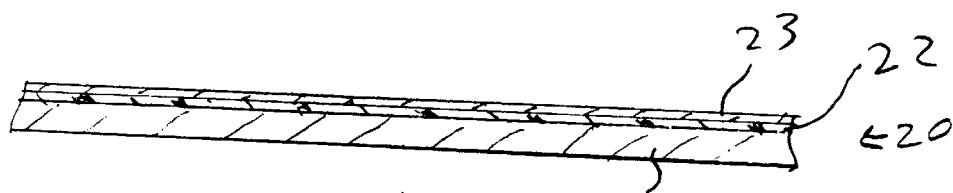
FIG. 3 is a three-layer structure comprising a nickel foil layer; a thin dielectric material layer, e.g., silica; and a thin zinc layer.

Illustrated in FIG. 3 is a three-layer structure 20 comprising a layer 21 of nickel foil, a deposited dielectric material layer 22, and a deposited layer of zinc 23. The dielectric material layer 22 will be discussed herein as being a silica layer, although other metal oxides having a melting point significantly above the boiling point of zinc could also be used. The nickel foil 21 is between about 2.5 and about 50 microns thick; the dielectric material layer 22 between about 0.05 and about 3 microns thick; and the zinc layer 23 between about 0.05 and about 3 microns thick.

Figure 4:
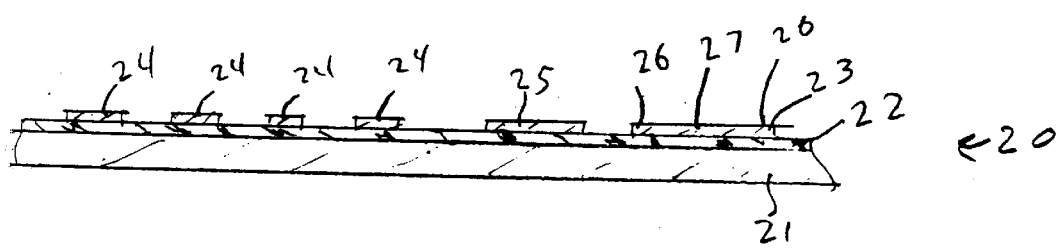
FIG. 4 is the three-layer structure of FIG. 3 in which the zinc layer has been patterned in accordance with the invention.

Illustrated in FIG. 4 is the three-layer structure 20 of FIG. 3 in which the zinc layer has been patterned by boiling off selected portions of the zinc layer with thermal energy provided by computer guided laser. This produces circuitry traces 24. Also, it is to be noted that patches 25 of zinc and the nickel foil define a capacitor electrical pathway. Again, because the thin zinc layer 23 may be less electrically conductive than other components, a resistive electrical pathway is defined between opposite ends 26 of isolated strips 27 of zinc defined by the laser-patterning. The patterned electronic circuitry may also include inductor components (not shown).

Figure 5:
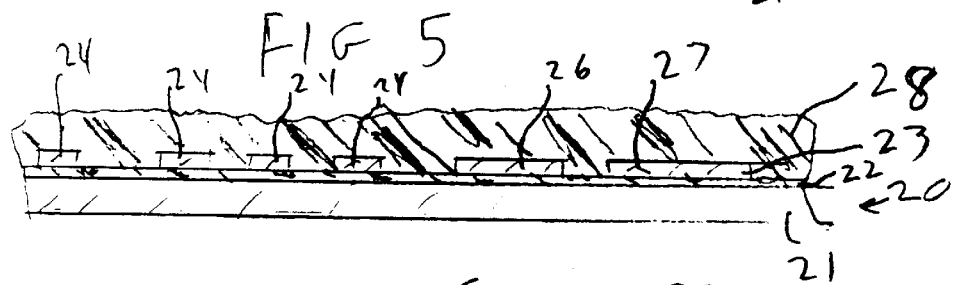
FIG. 5 is the three-layer structure of FIG. 4 in which the patterned zinc layer of FIG. 4 has been embedded in a dielectric material layer.
Figure 6:
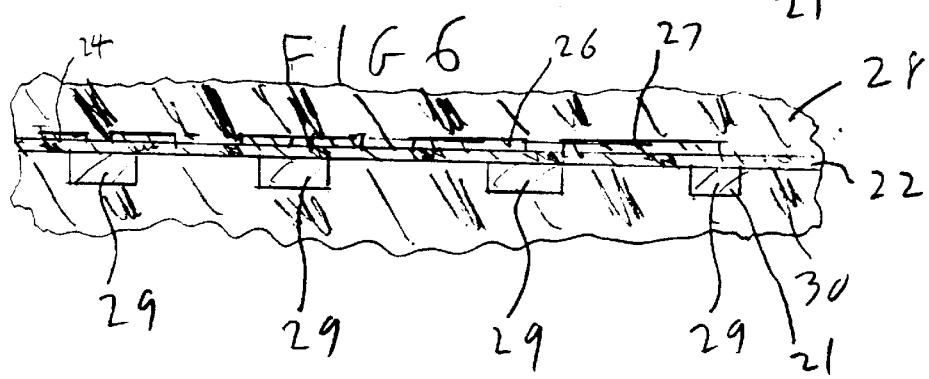
FIG. 6 is the structure of FIG. 5 in which the nickel foil has been circuitized and embedded in dielectric material.

After the zinc is patterned, this side of the structure may be embedded in a dielectric material 28, e.g., pre-preg, as shown in FIG. 5. At this time, the nickel layer may be patterned in a conventional manner, e.g., using conventional photoresist processing, as shown in FIG. 6 to provide circuitry traces 29. The patterned nickel layer 21 may then also be embedded in dielectric material 30. Again, the entire structure may be combined with similar layers to form a multi-layer printed circuit board.

Figure 7:
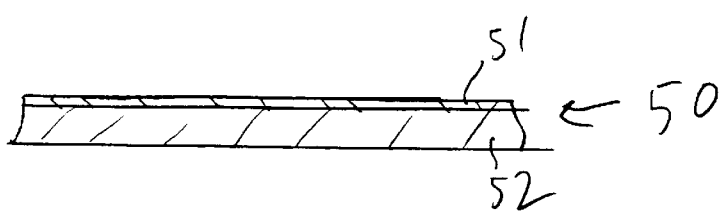
FIG. 7 is a cross-sectional view of a two-layer structure comprising a copper foil and a thin layer of silica-doped platinum deposited thereon.
Figure 8:
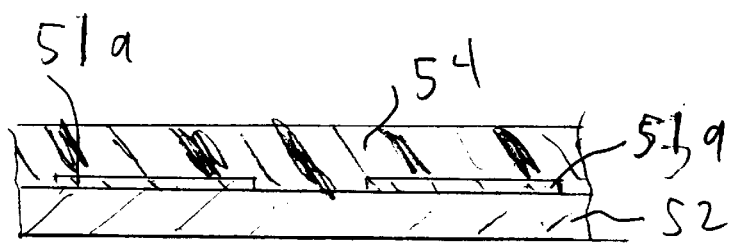
FIG. 8 is the structure of FIG. 7 in which the thin layer of platinum has been patterned by computer-guided laser and the patterned platinum layer embedded in dielectric material.
Figure 9:
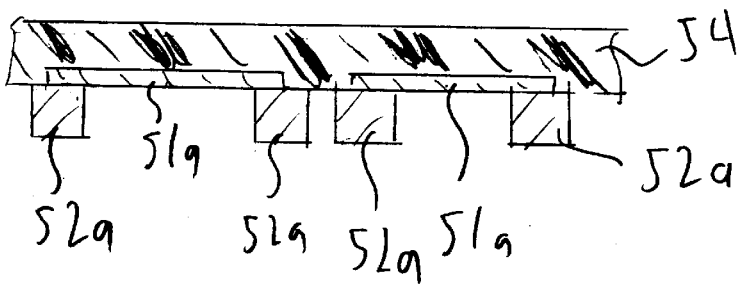
FIG. 9 is the structure of FIG. 8 in which the copper layer has been patterned in a conventional manner.

Illustrated in FIG. 7 is a two-layer structure 50 comprising a copper foil layer 52 on which is deposited a layer of platinum 51 between about 0.5 and 3 microns thick. The platinum is doped with between 0.5 and about 5 wt % of a dielectric, such as silica, such that the platinum, though still electrically conductive, is sufficiently electrically resistive to serve as a resistive element. Thermal energy provided by computer guided laser, such as the pulsed laser drilling apparatus sold by Hitachi noted above, will cause exposed portions of the platinum layer to ablate away from the copper. The exact mechanism for this ablation is not known, but the thermal energy results in very substantial loss of adhesion between the platinum and copper layer, resulting in the ablation of platinum from the copper. In FIG. 8, the platinum layer has been patterned by laser into patches 51a. These patches are then embedded in a layer 54 of dielectric material, such as prepreg, which supports the platinum patches 51a in the subsequent step. The copper layer 52 is then patterned into circuitry traces 52a as shown in FIG. 9. An electrically resistive pathway is formed between traces 52a at opposite ends of the resistive patches 51a through the resistive patches.

A variety of thin film materials on dissimilar substrates may be processed by laser ablation in accordance with the invention. For example, a thin film of copper on glass may be ablated by laser to form electronic circuitry traces. CCVD-deposited silica may be ablated from a copper foil in the manner that the resistive material of FIGS. 7–9 is ablated from a copper foil substrate.

The invention will now be described in greater detail by way of specific examples

EXAMPLE 1

On a glass substrate, 0.025 mm thick, are deposited, first on one side, and then the other, a 0.15 micron layer of metallic zinc. The zinc layers are each deposited from a 0.0350 M solution of zinc bis(2-ethylhexanoate) in anhydrous ethyl ether. The solution is sprayed at 1.00 sccm, into a tube which is also fed with 40 lpm of a preheated 500° C. 10% $H_2$/Ar gas mixture. The injection is approximately 5 cm from the tube exit. The substrate is located normal to the gas flow approximately 2 mm from the tube exit.

Each zinc layer is patterned into electronic circuitry by a computer guided laser which melts and boils away zinc from selected portions of the glass substrate.

EXAMPLE 2

On one surface of a zinc foil substrate 15 microns thick is deposited a silica layer 0.15 microns thick. The deposition is accomplished by using CCVD. The precursor solution consisted of 0.873 wt % tetramethoxyloxysilane, 7.7 wt % isopropyl alcohol and 91.4 wt % propane. The solution is then nebulized by near supercritical atomizer into a flame. The flame is directed at the nickel foil and the deposition is completed in 10 minutes.

A layer of zinc 0.15 microns thick is deposition the silica layer by the method of Example 1.

The zinc layer is patterned to form electronic circuitry components by input of thermal energy provided by a computer guided laser which melts and boils away zinc from selected portions of the glass substrate.

The patterned zinc layer is embedded in pre-preg, and the pre-preg is cured.

The nickel foil is the circuitized in a conventional manner by covering the nickel with a negative acting photoresist, exposing the photoresist through artwork to patterned actinic radiation, removing unexposed portions of the photoresist, and etching the nickel with ammoniacal cupric chloride solution. The remaining photoresist is then stripped and the patterned nickel is then embedded in pre-preg and the pre-preg cured.

EXAMPLE 3

A 0.15 micron thick layer of Pt/$SiO_2$ resistive material is deposited by CCVD on 15 micron thick copper foil using deposition conditions as follows:

| Solution preparation: | 1.23 g diphenyl-(1,5-cyclooctadiene) Platinum (II) |
| --- | --- |
| | 250 ml toluene |
| | 0.43 g tetraethoxysilane (1.5 wt % Si in toluene) |
| | 150 g propane |
| Deposition conditions: | Solution flow: 3 ml/min |
| | Deposition time: 18 min for 5" × 6" substrate |
| | # of passes: 6 |
| | Deposition temp. 500° C./ |
| | Variac 3.0A |
| | Tip Oxygen flow: ~2900 ml/min |

The Pt/$SiO_2$ side is selectively exposed to pulsed laser energy from an Hitachi laser drill to form discrete patches of the Pt/$SiO_2$. This side is then embedded in prepreg and the prepreg cured. The copper side is then covered with photoresist, exposed to actinic radiation, and the photoresist developed. The copper is etched with ferric chloride solution, thereby forming circuitry traces which connect with the Pt/$SiO_2$ patches to form electrically resistive pathways.

What is claimed is:

1. A method of forming thin layer electronic circuitry components comprising in order the steps of depositing a thin layer of conductive material on a substrate of dissimilar material and exposing selected portions of said thin layer to thermal energy provided by a computer guided laser, provided that when the substrate is a dielectric material it has a thickness of from 0.05 to 3 microns.

2. The method of claim 1 wherein said thin layer is between about 0.05 and about 3 microns thick.

3. The method of claim 1 wherein said thin layer is deposited on a metal foil.

4. The method of claim 1 wherein said thin layer is platinum or doped platinum and said substrate is metal foil.

5. The method of claim 4 wherein said metal foil is copper.

6. A method of forming electronic circuitry, the method comprising:

providing a substrate of dielectric material, depositing on said substrate a layer of electrically conductive material to a thickness of between about 0.05 and about 3 microns, said conductive material having a boiling point, said dielectric material having a melting point or a decomposition temperature above said boiling point of said conductive material, and supplying thermal energy to selected portions of said layer of conductive material to boil off selected portions of said conductive material, leaving electronic circuitry components on said substrate.

7. The method of claim 6 wherein said thermal energy is provided by computer guided laser.

8. The method of claim 6 wherein said conductive material is a zero valence metal.

9. The method of claim 6 wherein said conductive material is zero valence zinc.

10. The method of claim 6 wherein said dielectric material is a metal or a metalloid oxide.

11. The method of claim 6 wherein said dielectric material is silica.

12. The method of claim 6 wherein said conductive material is deposited on said substrate by either combustion chemical vapor deposition or controlled atmosphere chemical vapor deposition.

13. The method of claim 6 wherein said dielectric material has a boiling point or a decomposition temperature at least about 200° C. above said boiling point of the electrically conductive material.

14. The method of claim 6 wherein said substrate of dielectric material is a layer between about 0.05 and about 3 microns thick on a backing layer of metal having a melting point above said boiling point of said electrically conductive material layer.

15. The method of claim 14 wherein said metal backing layer is a metal foil between about 2.5 and about 50 microns thick.

16. The method of claim 14 wherein said metal of said backing layer is nickel.

17. The method of claim 14 wherein said layer of electrically conductive material is metallic zinc.

18. The method of claim 14 wherein said dielectric material layer is a metal or a metalloid oxide.

19. The method of claim 14 wherein said dielectric material layer is silica.

20. The method of claim 14 wherein said dielectric material layer is deposited by combustion chemical vapor deposition or controlled atmosphere combustion chemical vapor deposition.

21. The method of claim 14 further comprising embedding said electronic circuitry components formed from said layer of conductive material in dielectric material and circuitizing said metal backing layer.

22. The method of claim 14 wherein said metal of said backing material has a melting point at least about 200° C. above said boiling point of said electrically conductive material.

23. The method of claim 1 wherein the substrate is nickel foil or a dielectric material.

24. The method of claim 23 wherein the dielectric material further comprises a metal backing layer.

* * * * *